(12) United States Patent
Hwang

(10) Patent No.: US 6,706,567 B2
(45) Date of Patent: Mar. 16, 2004

(54) HIGH VOLTAGE DEVICE HAVING POLYSILICON REGION IN TRENCH AND FABRICATING METHOD THEREOF

(75) Inventor: Lee-Yeun Hwang, Cheongju (KR)

(73) Assignee: Hynix Semiconductor, Inc., Kyoungki-Do (KR)

(*) Notice: Subject to any disclaimer, the term of this patent is extended or adjusted under 35 U.S.C. 154(b) by 35 days.

(21) Appl. No.: 09/863,452

(22) Filed: May 24, 2001

(65) Prior Publication Data

US 2002/0013029 A1 Jan. 31, 2002

(30) Foreign Application Priority Data

Jul. 28, 2000 (KR) ............................. 2000/43812

(51) Int. Cl.$^7$ .................. H01L 21/332; H01L 21/8238; H01L 21/331
(52) U.S. Cl. .................. 438/140; 438/203; 438/259; 438/286; 438/335
(58) Field of Search ................. 438/268, 300, 438/270, 254, 700, 286, 306; 257/339, 340, 341, 342, 345

(56) References Cited

U.S. PATENT DOCUMENTS

| | | | | |
|---|---|---|---|---|
| 5,640,034 A | * | 6/1997 | Malhi | 257/341 |
| 5,869,875 A | * | 2/1999 | Hebert | 257/382 |
| 6,258,674 B1 | * | 7/2001 | Kwon et al. | 438/286 |

* cited by examiner

Primary Examiner—Carl Whitehead, Jr.
Assistant Examiner—David L. Hogans
(74) Attorney, Agent, or Firm—Birch, Stewart, Kolasch & Birch, LLP

(57) ABSTRACT

A high voltage device prevents or minimizes the lowering of a maximum operating voltage range. Bulk resistances of the drift regions are reduced by forming trenches within the drift regions and filling the trenches with conductive polysilicon layers. The polysilicon layers reduce the bulk resistances and prevents or minimizes the operation of parasitic bipolar junction transistors typically formed when the high voltage device is manufactured.

10 Claims, 4 Drawing Sheets

HIGH VOLTAGE DEVICE HAVING POLYSILICON REGION IN TRENCH AND FABRICATING METHOD THEREOF

BACKGROUND OF THE INVENTION

1. Field of the Invention

The present invention relates to a high voltage device and a method for fabricating the same, and more particularly a high voltage device having a polysilicon region in a trench which is capable of mitigating the disadvantage that a maximum operating voltage is lowered due to a latch-up phenomenon by a parasitic bipolar device in a conventional high voltage device.

2. Description of the Background Art

Compared to a general semiconductor device which has an operating voltage range of about 5V, a high voltage device has an operating voltage range from about 40 to 100V. The high voltage device has a structure similar to that of a MOSFET.

FIG. 1A is a sectional view of a conventional double diffused metal oxide semiconductor (DMOS), which is a high voltage device. As shown, an oxide film 2 and a high voltage P-well 3 is sequentially formed on a substrate 1. A P-type drift region 5 and an N-type drift region 4 are formed on the high voltage P-type well 3. A source region 7 is formed on the P-type drift region 5 and a drain region 6 is formed on the N-type drift region 4. A gate region 9 is formed at an upper portion between the P-type drift region 5 and the N-type drift region 4. A gate oxide film and a source and a drain electrodes are omitted on the drawing.

The N-type drift region 4 and the P-type drift region 5 of the conventional DMOS device are formed by doping the substrate lightly with N and P type impurities, respectively near the source and drain regions much like a lightly doped drains (LDD) of a conventional semiconductor device. Because the drift regions 4 and 5 are lightly doped, bulk resistances ($R_b$) of the drift regions are high.

The conventional high voltage device as shown in FIG. 1A includes a parasitic bipolar junction transistor (BJT) 10 which is formed by the N-type drift region 4, the P-type drift region 5 and the heavily doped source region ($N^+$) 7. The parasitic BJT 10 degrades the operation of the high voltage device.

When the parasitic BJT 10 operates, a collector current of the BJT 10 rapidly increases at a lower voltage than a breakdown voltage of the high voltage device. This lowers the maximum operating voltage of the high voltage device.

FIG. 1B is a graph showing that the maximum operating voltage of the high voltage device is lowered due to the parasitic BJT 10. FIG. 3 shows an equivalent circuit of the high voltage device including the parasitic BJT 10.

The parasitic BJT 10 operates under the following mechanism. Positive holes generated due to impact ionization in the N-type drift region 4 fail to penetrate a potential barrier of the junction between the $N^+$ source region 7 and the P-type drift region 5, and instead flows to the $P^+$ bulk region 8 after passing below the $N^+$ source region 7.

When the positive hole current 12 reaches a certain level, the voltage drops so low as to bias in the forward direction the junction between the $N^+$ source region 7 and the P-type drift region 5 due to the bulk resistance ($R_b$) and thus operating the parasitic BJT 10.

When the parasitic BJT 10 operates, it goes to a latch-up state in which the collector current is not controlled by the voltage applied to the gate and thus the maximum operating voltage is reduced due to the voltage drop across the bulk resistance $R_b$ of the P-type drift region 5.

FIG. 2 is a sectional view of a second conventional DMOS device in accordance with the conventional art which attempts to mitigate the lowering of the maximum operating voltage range. As shown, to mitigate the lowering of the maximum operating voltage caused by the latch-up phenomenon, the $P^+$ bulk region (8'), next to the $N^+$ source region 7, is formed deep and wide to reach the oxide film 2. This reduces the bulk resistance ($R_b$) of the P-type drift region 5.

However, the second conventional device also has problems. First, in order to form the deep and wide $P^+$ bulk region 8', a diffusion process to form the $P^+$ bulk region 8' must be performed over a long time period. Moreover, the resistance is reduced only in the vicinity of the source region 7. It is impossible to lower the resistance of the P-type drift region near a channel below the gate region.

SUMMARY OF THE INVENTION

Therefore, an object of the present invention is to provide a fundamental solution to prevent or mitigate the lowering of the maximum operating voltage range of a high voltage device due to a latch-up. Another object is to provide a suitable method to fabricate the high voltage device.

To achieve these and other advantages and in accordance with the purpose of the present invention, in one aspect of the present invention, a high voltage device includes an N-type drift region and a P-type drift region formed on a substrate; a gate region defined at an intersection between the N and P-type drift region, the gate region having an oxide film deposited on an upper portion of the gate region and a gate electrode formed on the oxide film; a source region being defined in one of the N and P-type drift regions, the source region having a first trench filled with a first polysilicon layer, a first high density diffusion layer formed on an upper portion of the first polysilicon layer and a source electrode formed on the high density diffusion layer; and a drain region being defined in the other of the N and P-type drift regions, the drain region having a second high density diffusion layer formed on an upper portion of the drain region and a drain electrode formed on the second high density diffusion layer.

In another aspect of the present invention, a method to fabricate a high voltage device includes forming an N-type drift region and a P-type drift region on a substrate; forming a first trench in a source region, the source region being defined in one of the N and P-type drift regions; forming a first polysilicon layer filling the first trench; forming a first high density diffusion layer on a first upper portion of the first polysilicon layer and on an upper portion of the one of the N and P-type drift region adjacent to the first trench; depositing an oxide film on an upper portion of a gate region, the gate region being defined near an intersection between the N and P-type drift regions and occupying portions of the N and P-type drift regions; forming a gate electrode on the oxide film; and forming a metal electrode on the first high density diffusion layer.

In a further aspect of the present invention, a high voltage device includes a substrate; a first drift region and a second drift region formed in the substrate; a gate electrode formed over a gate region, the gate region being defined over an intersection of said first and second drift regions such that said gate region includes a part of said first drift region and a part of said second drift region; a first trench formed in a source region, the source region being defined in said first drift region; a first polysilicon layer filling the first trench; a first high density diffusion layer formed in an upper portion of the source region including a portion of the first polysilicon layer and a portion of the first drift region in between the first trench and the gate region; and a second high density diffusion layer formed in a drain region, the drain region being defined in the second drift region.

In a still further aspect of the present invention, a method to fabricate a high voltage device includes forming a first drift region and a second drift region in a substrate; forming a gate electrode over a gate region, the gate region being defined over an intersection of said first and second drift regions such that said gate region includes a part of said first drift region and a part of said second drift region; forming a first trench in a source region, the source region being defined in said first drift region; filling the first trench with a first polysilicon layer; forming a first high density diffusion layer in an upper portion of the source region including a portion of the first polysilicon layer and a portion of the first drift region in between the first trench and the gate region; and forming a second high density diffusion layer in a drain region, the drain region being defined in the second drift region.

As noted above, FIG. 3 shows an equivalent circuit of the conventional high voltage device which includes the parasitic BJT. As shown, a voltage drop occurs across the base resistance ($R_b$) of an NPN transistor and thus reduces a drain voltage of the high voltage device. The embodiments of the present invention is prevents or minimizes the bulk resistance ($R_b$) to thereby prevent or minimize the maximum operating voltage range from being lowered.

The foregoing and other objects, features, aspects and advantages of the present invention will become more apparent from the following detailed description of the present invention when taken in conjunction with the accompanying drawings. BRIEF DESCRIPTION OF THE DRAWINGS The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiment of the present invention, examples of which are illustrated in the accompanying drawings.

Figure 1A:
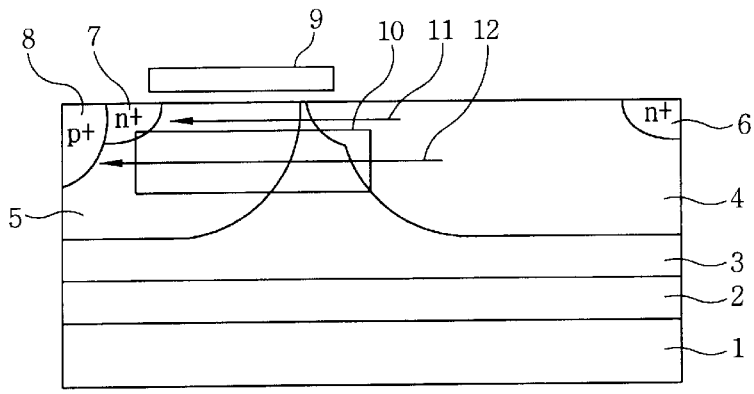
FIG. 1A is a sectional view of a first conventional DMOS device.
Figure 1B:
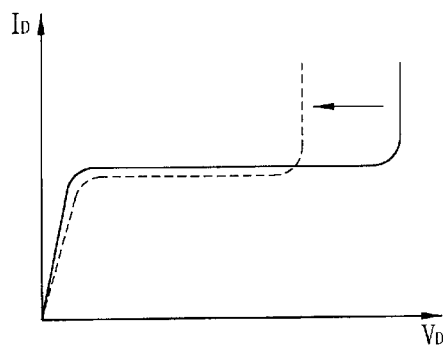
FIG. 1B is a graph showing a current-voltage characteristic of the first DMOS device of FIG. 1A.
Figure 2:
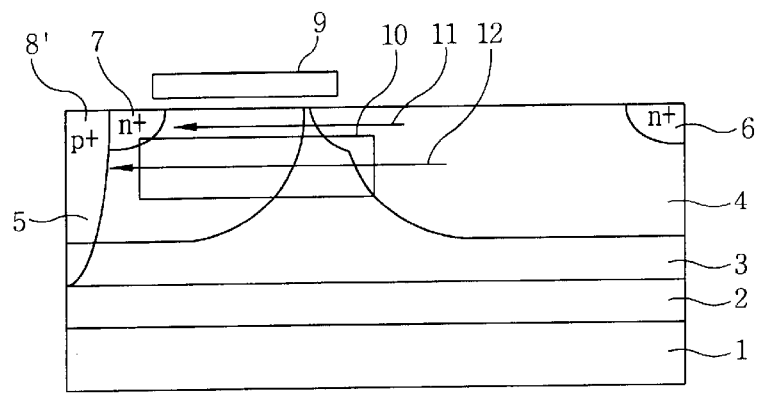
FIG. 2 is a sectional view of a second conventional DMOS device.
Figure 3:
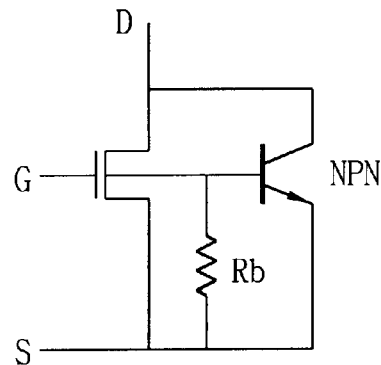
FIG. 3 is a diagram of an equivalent circuit of the conventional high voltage device showing the parasitic BJT.
Figure 4:
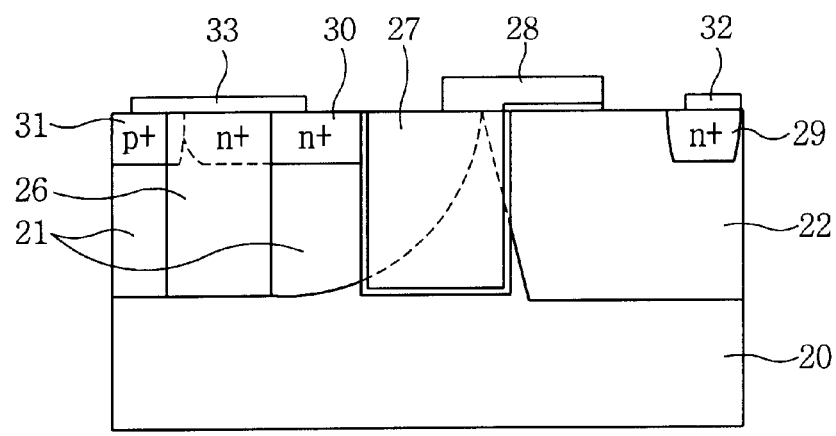
FIG. 4 is a sectional view of a high voltage device in accordance with an embodiment of the present invention.

FIG. 4 is a sectional view of a high voltage device in accordance with the embodiment the present invention. As shown, a gate polysilicon 27 in a first trench structure 24. The first trench structure 24 is defined to be in a gate region between one peak of a P-type drift region 21 and an N-type drift region 22. The P and N-type drift regions 21 and 22 are formed on a P-type substrate 20. A polysilicon 26, made of the same material as the gate polysilicon 27, if formed in a second trench structure 23. The second trench structure 23 is defined to be in a source region between two peaks of the P-type drift region 21.

Since polysilicon is low in resistance, the polysilicon 26 formed at the source region serves to lower a bulk resistance of the P-drift region 21. This in turn mitigates the reduction of the maximum operating voltage of the high voltage device.

FIGS. 5A through 5F show a method of fabricating the high voltage device in accordance with the embodiment of the present invention.

Figure 5A:
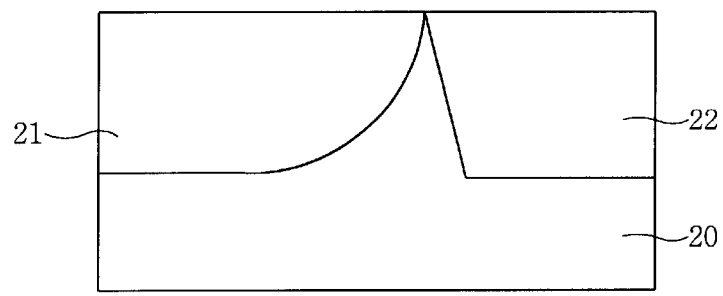
FIGS. 5A through 5F show a method of fabricating the high voltage device in accordance with the embodiment of the present invention.

As shown in FIG. 5A, the P and N-type drift regions 21 and 22 are formed on the P-type substrate 20 by diffusion. Each region has a different shape. The reason for this is to facilitate forming of a gate in the trench structure. The depth of the N-type drift region 22 is substantially equally to the depth of the P-type drift region 21 as shown in FIG. 5A.

Figure 5B:
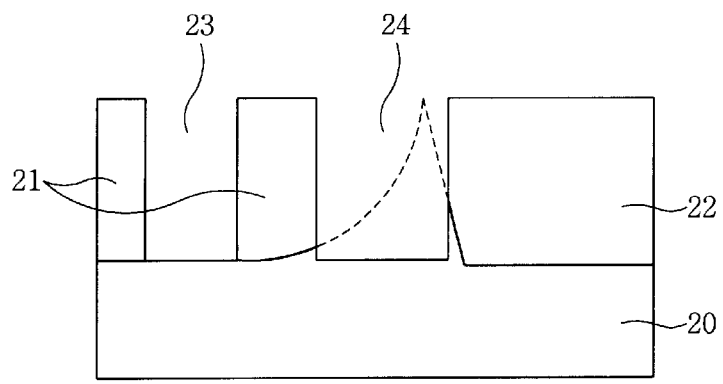

After the P-type drift region 21 and the N-type drift region 22 are formed, as shown in FIG. 5B, first and second trenches 24 and 23 are formed at the source region and the gate region by patterning and etching the P and N-type drift regions 21 and 22. The first trench 24 formed at the gate region is to form a gate, and the second trench 23 formed at the source region is to lower the bulk resistance of the P-type drift region 21 of the source region. The first trench 24 and the second trench 23 are formed together in a single process, so that no additional fabricating process is necessary when forming the trench gate.

Figure 5C:
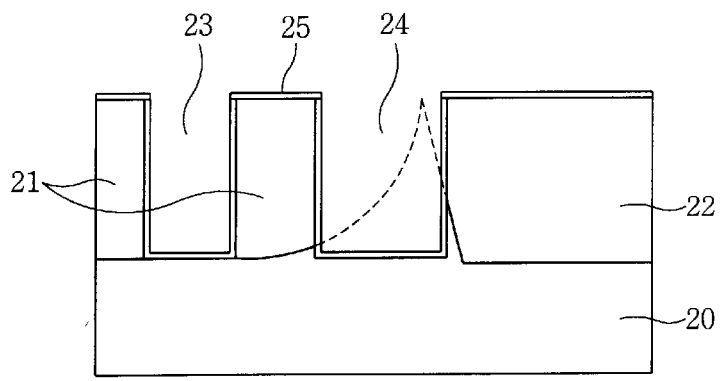
Figure 5D:
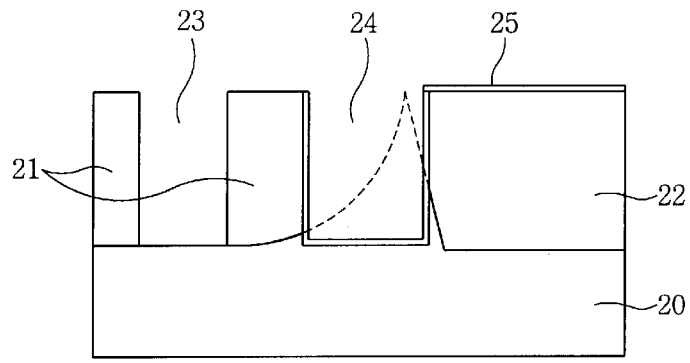

After the first and second trenches 24 and 23 are formed, as shown in FIG. 5C, the gate oxide film 25 is deposited. The gate oxide film 25 is then partially removed so that no oxide film remains except for the region where a gate is to be formed, as shown in FIG. 5D.

Figure 5E:
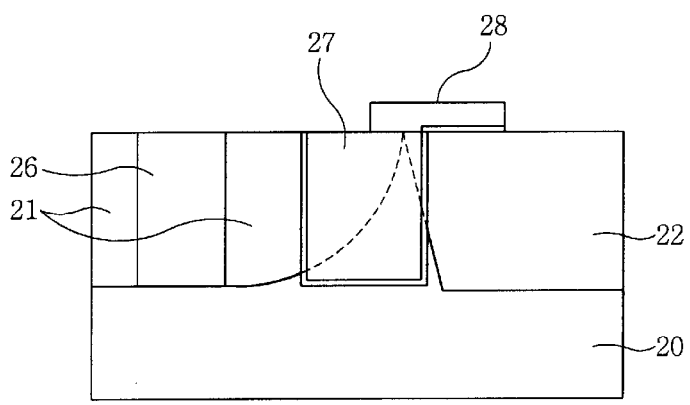

Thereafter, as shown in FIG. 5E, polysilicon is deposited and planarized to form the polysilicon 27 and 26 in the first and second trenches 24 and 23, respectively. And then a gate electrode 28 is formed to partially cover the polysilicon 27 and also partially cover the N-type drift region 22. Forming the gate electrode 28 in this manner allows current to be controlled smoothly.

Figure 5F:
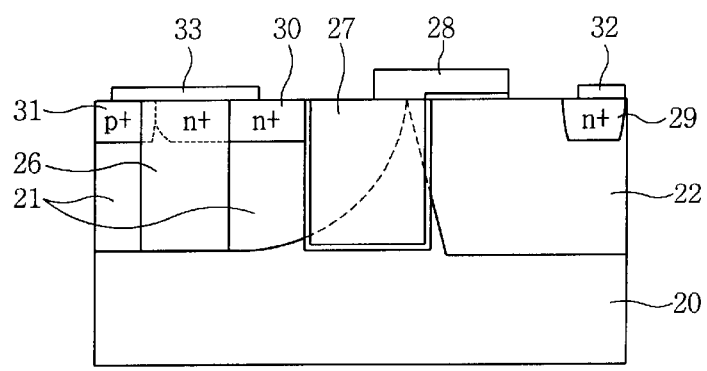

As shown in FIG. 5F, after the gate electrode 28 is formed, $N^+$ type high density diffusion layers 30 and 29 are formed at the source region and the drain region, and a $P^+$ type high density diffusion layer 31 is formed at the source region. And then, metal electrodes 33 and 32 are formed at the source and drain regions. The depths of N+ type high density diffusion layer 29, $N^+$ type high density diffusion layer 30, and $P^+$ type high density diffusion layer 31 are substantially equal as shown in FIG. 5F.

When polysilicon in trench structures are formed at the drift region of the high voltage device in a manner as stated above according to the present invention, the doping density at the bulk portion becomes high, so that its resistance is low leading to a small voltage drop. Thus the maximum operating voltage of the device can be maintained.

In addition, in case of the trench gate device, since the gate region is widened, the control of the current is improved which prevents or reduces the likelihood of a latch-up problem from occurring.

As so far described, according to the high voltage device having a polysilicon region in trench structure structures according to the embodiment of the present invention, the bulk resistance is lowered by the presence of polysilicon in the trenches. Thus the latch-up problem prevalent in the conventional art is prevented or minimized leading to preventing or minimizing of the lowering of the maximum operating voltage.

In addition, no diffusion process, which requires a long processing time, is required like in the conventional art, so that the fabricating process becomes economical.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims.

What is claimed is:

1. A method for fabricating a high voltage device, comprising:

forming an N-type drift region and a P-type drift region on a substrate;

forming a first trench in a source region, the first trench being defined inside an area surrounded by two peaks of the P-type drift region;

forming a first polysilicon layer filling the first trench, the first polysilicon layer having a first upper portion located within the first trench;

forming a first high density diffusion layer into the first upper portion of the first polysilicon layer in the first trench and into an upper portion of the P-type drift region adjacent to the first trench;

depositing an oxide film on an upper portion of a gate region, the gate region being defined near an intersection between the N and P-type drift regions and occupying portions of the N and P-type drift regions;

forming a gate electrode on the oxide film; and forming a metal electrode on the first high density diffusion layer.

2. The method according to claim 1, wherein in the step of forming the first trench, a second trench is formed in the gate region.

3. The method according to claim 1, wherein the first polysilicon layer is formed in the first trench, and the first trench has a depth that is substantially equal to a depth of the P-type drift region where the source region is defined.

4. The method according to claim 1, wherein the first high density diffusion layer is an $N^+$ layer.

5. The method according to claim 4, further comprising:

a second high density diffusion layer on an upper portion of the N-type drift region.

6. The method according to claim 5, wherein the second high density diffusion layer comprises an $N^+$ layer.

7. The method according to claim 4, further comprising:

a third high density diffusion layer in the source region adjacent to the first high density layer.

8. The method according to claim 7, wherein the third high density diffusion layer is a $P^+$ layer.

9. The method according to claim 1, wherein a depth of the N-type drift region is substantially equally to a depth of the P-type drift region.

10. The method according to claim 8, wherein depths of the first, second, and third high density diffusion layers are substantially equal.

* * * * *